United States Patent [19]

McCormack et al.

[11] 4,242,706
[45] Dec. 30, 1980

[54] VISIBLE LIGHT AND NEAR INFRARED IMAGING DEVICE

[75] Inventors: Kent McCormack, Richardson; James E. Robinson, Dallas; William M. Knight, Jr., Plano; Dana Dudley, Dallas, all of Tex.

[73] Assignee: Texas Instruments Incorporated, Dallas, Tex.

[21] Appl. No.: 960,496

[22] Filed: Nov. 13, 1978

[51] Int. Cl.² ............................................. H04N 3/14
[52] U.S. Cl. .................................. 358/213; 358/113; 250/211 J; 250/338; 357/32
[58] Field of Search ............................ 358/213, 113; 250/211 J, 338, 330, 332, 333; 357/30, 31, 32

[56] References Cited

U.S. PATENT DOCUMENTS

| | | | |
|---|---|---|---|
| 3,946,151 | 3/1976 | Kamiyama et al. | 358/213 |
| 4,067,046 | 1/1978 | Nakatamt et al. | 358/213 |

Primary Examiner—Robert L. Griffin
Assistant Examiner—Edward L. Coles
Attorney, Agent, or Firm—Rene' Grossman; James T. Comfort; Alva H. Bandy

[57] ABSTRACT

A visible light and near infrared imaging device is disclosed. The imaging device comprises X-Y addressing means, an array of opto-electronic semiconductor elements or cells, a multiplexer, a precharge switch, and an amplifier. The X-Y addressing means selectively addresses each cell of the array of opto-electronic semiconductor cells and corresponding multiplexer switch for connecting a reference voltage to each cell to charge each element to the reference voltage, then to isolate each element and vary its voltage in proportion to the intensity of the impinging light, and finally to read out selectively the voltage of each element to the amplifier for amplifying the electrical signals representative of the light intensity to a working level for processing into video signals.

11 Claims, 4 Drawing Figures

VISIBLE LIGHT AND NEAR INFRARED IMAGING DEVICE

This invention relates to imaging devices, and more particularly, to a two-dimensional visible and near infrared energy imaging device using matrix addressing.

In the past, solid state imaging devices have consisted of a simple CCD shift register, clocked so that the shift out time is much less than the integration time of separate sensors, a shielded readout resistor of a line of sensors and two shielded readout registers. In the CCD type imaging device, the image is stored in the form of charge packets and these packets are sensed by moving them along the surface from one element to another until they are sensed by a sense diffusion at the end of a row of columns of detector elements. The CCD imaging device has some inherent disadvantages. For example, each time a charge packet moves there is a transfer inefficiency (CTI) which leads to charge loss. If CTI is too large resolution or modular transfer function (MTF) may be degraded to the point of making the chip unsuitable for use. Another disadvantage is the presence of point defects in the CCD. Point defects completely disrupt the transfer of charge along a row or column of CCD elements. One point defect can cause the loss of a complete row of video information and render the CCD chip unusable. These problems seriously affect the yield of usable CCD devices.

The above mentioned problems attending CCD imaging devices are substantially reduced by the charge injection device (CID). The CID is simpler to fabricate than the CCD. The CID is X-Y addressed and therefore lends itself to random access. The output capacitance of the CID is the capacitance of one row and one column if all other rows and columns are isolated during the readout of a given cell. For two dimensional CID arrays, each sensor element consists of two separate electrodes for two storage capacitors. One of the electrodes is connected to a horizontal access line, the other to a vertical line. In operation of the CID, the charge is stored in the potential well when an electrode voltage is applied. The charge is transferred to the second potential well when the voltage of the first electrode is switched off and the voltage is applied to the second electrode. The injection of the stored charge in the particular sensor cell will occur only when both electrode voltages are switched off. Successful operation of the CID requires that the two electrodes overlap. This overlapping creates a fabrication problem. The nearness of one electrode to the other at the overlapping portions often results in shorts between the electrodes; these shorts render the CID imaging device inoperable.

Accordingly, it is an object of the invention to provide an improved X-Y addressable imaging device.

A further object of the invention is to provide an imaging device which is easy to fabricate and economical.

Another object of the invention is to provide an imaging device which is readily addressed and which lends itself to random access.

Still another object of the invention is to provide an imaging device having reduced noise level of operation.

Yet another object of the invention is to provide a low power consumption imaging device.

Briefly stated the imaging device of this invention is an optical imaging sensor fabricated on a substrate of semiconductor material responsive to visible and near infrared radiation with potential sensitivities approaching that of low light level TV. The surface of the semiconductor material substrate has formed therein the imager elements including a matrix of sensing cells and corresponding address switches.

The novel features believed to be characteristic of this invention are set forth in the appended claims. The invention itself, however, as well as other objects and advantages thereof may best be understood by reference to the following detailed description of the illustrative embodiments when read in conjunction with the accompanying drawings in which:

Figure 1:
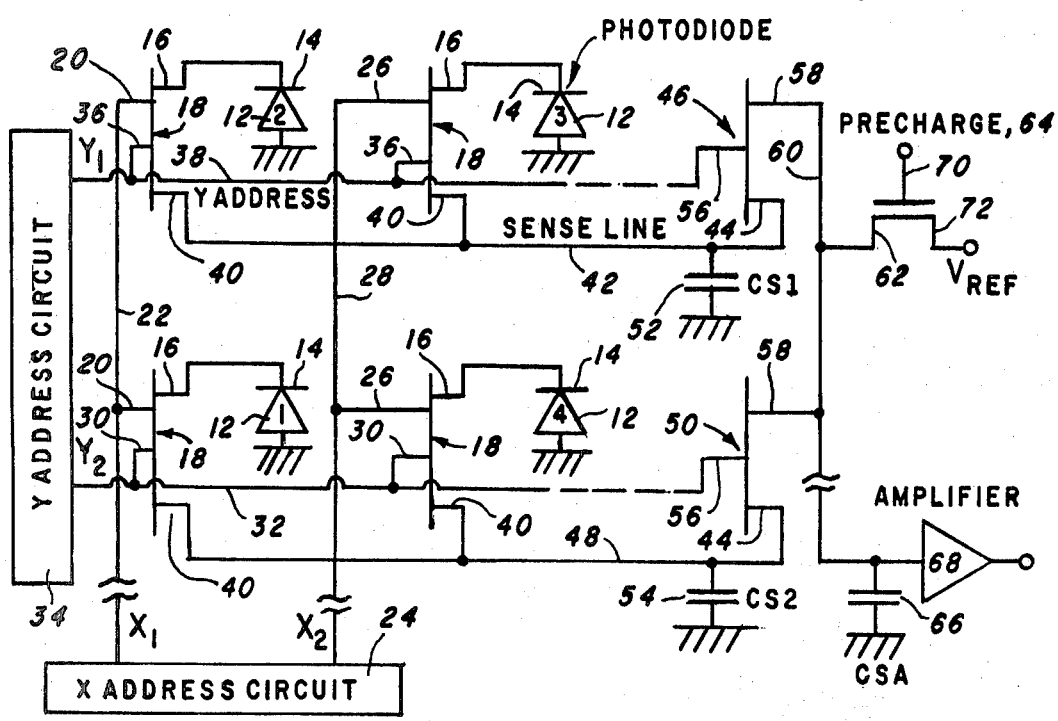
FIG. 1 is a partial schematic view of the imaging device.
Figure 4:
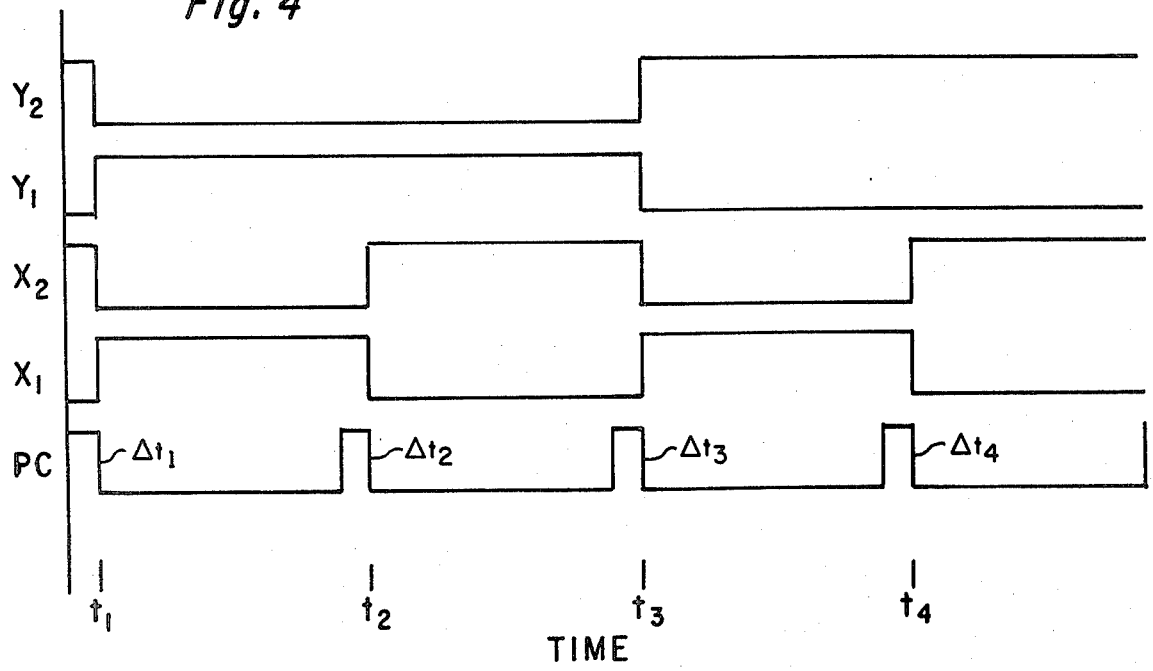

FIG. 4 is a clocking diagram for the imaging device of FIG. 1. Referring now to FIG. 1 in which is shown, for illustrative purposes only, a two by two matrix array imaging device. A practical matrix size would be $10^4$ cells with 100 cells along each axis. The imager 10 (FIG. 1) includes four photoconductive cells numbered 1, 2, 3, and 4. The cells 1-4 are photodiodes having their anodes 12 connected to ground and their cathodes 14 connected to drains 16 of dual gate MOSFET switches 18. Although other type semiconductor switches could be utilized, the dual gate MOSFET switch is preferred because it reduces substantially the size of the elements. Gates 20 of switches 18 for cells 1 and 2 are connected to lead 22 connected to the $X_1$ terminal of X address circuit 24, and gates 26 of the switches for cells 3 and 4 are connected by lead 28 to the $X_2$ terminal of X address circuit 24. Whereas gates 30 of the switches for cells 1 and 4 are connected by lead 32 to the $Y_2$ terminal of Y address circuit 34, and gates 36 of the switches for cells 2 and 3 are connected by lead 38 to the $Y_1$ terminal of Y address circuit 34. Sources 40 of the switches for cells 2 and 3 are connected to a sense line 42 which is connected to drain 44 of multiplexer switch 46. While sources 40 of the switches for cells 1 and 4 are connected by sense line 48 to drain 44 of multiplexer swith 50. Sense lines 42 and 48 have inherent capacitances which are indicated as capacitors 52 and 54.

Gates 56 of multiplexer switches 46 and 50 are connected respectively to conductors 38 and 32 leading to the $Y_1$ and $Y_2$ terminals of Y address circuit 34. Whereas the sources 58 of multiplexer gates 46 and 50 are connected by lead 60 to source 62 of precharge switch 64 and to the output amplifier 68. The capacitor 66 represents the inherent capacitance of lead 60 and output amplifier 68. The inherent capacitance of leads 42, 48, 60, represented by capacitors 52, 54 and 66, attenuates the signal voltage from the cells. The precharge switch 64 has its gate 70 connected to a timer and control circuit (not shown) and its drain 72 connected to the output of a voltage reference source (not shown).

Figure 2:
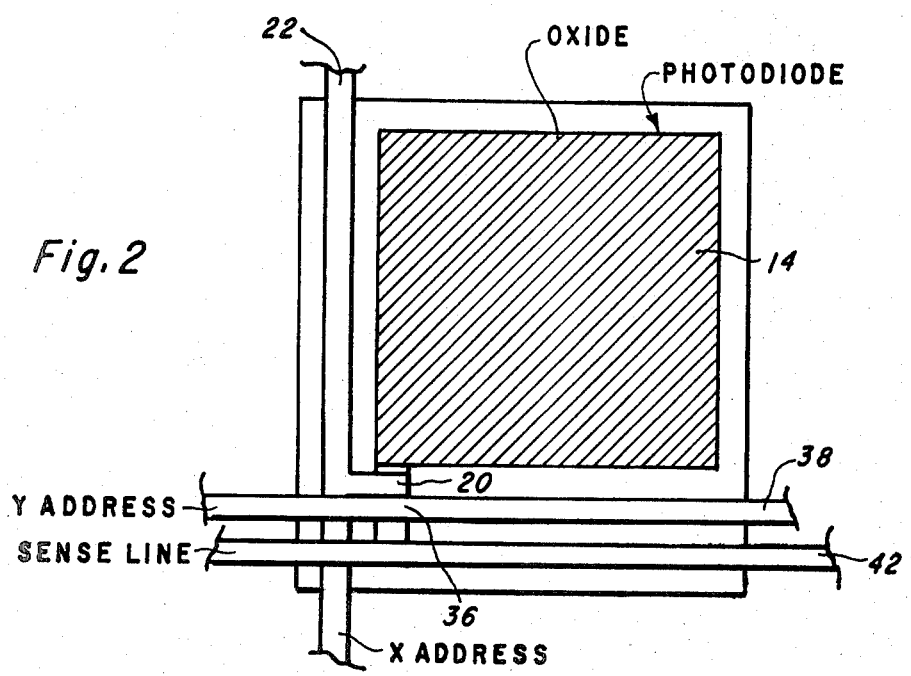
FIG. 2 is a plan view of a single cell of the imaging device.
Figure 3:
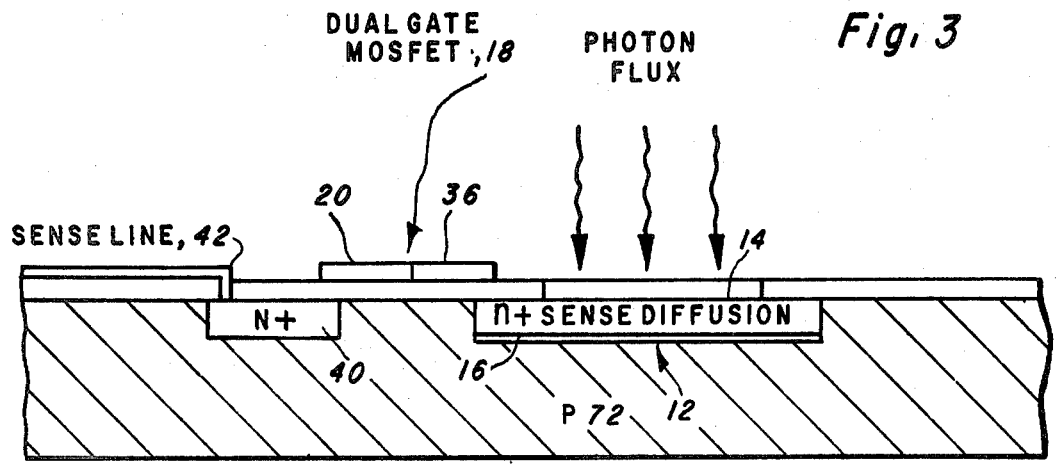
FIG. 3 is a partial cross sectional view of the single cell of FIG. 2.

Referring now to FIGS. 2 and 3 for a description of a single solid state cell of the array of cells. As each cell of the array of cells are identical only one cell need be described.

Cell 2 (FIG. 2) comprises a photodiode having a cathode 14, an anode 12 (FIG. 3), and a dual gate MOSFET switch 18 (FIG. 3) connecting the photodiode to sense line 42 (FIGS. 2 and 3). An X address line 22 (FIG. 2) connects the cell to the X address circuit; and a Y address line 38 connects the cell to the Y address circuit. The dual gate MOSFET switch 18 (FIG. 3) includes gates 20 and 36. Gate 36 is an integral part of Y address line 38 and defined by the crossing of MOSFET structure by the Y address line 38. Gate 20 is an extension of X address line 22. Source 40, drain 16, and sense diffusion region or cathode 14 are N+ regions formed in P type substrate 72 which portion under the sense diffusion forms the anode 12 of the photodiode.

During operation the depletion region between the n+ diffusion (cathode 14) (FIG. 3) and the p-type substrate 72 (anode 12) acts as a photodiode. Photons striking the sense diffusion area generate electron/hole pairs which are collected on the junction capacitance and associated strays as a voltage. The gates of the dual gate MOSFET are controlled by the X and Y address lines running to each cell. The sense line is used to perceive the voltage on the diode and apply it through lead 60 to the output amplifier 68 (FIG. 1).

Imager operation is illustrated by FIGS. 1 and 4. The operating cycle may begin at any point in the cycle. However, as shown, for example, in FIG. 4 at time $t_2 - \Delta t_2$ terminals $Y_1$ and $X_1$ are logic one (high), while terminals $Y_2$ and $X_2$ are logic zeros (low) and a precharge pulse PC exists. With terminals $Y_1$ and $X_1$ high, conductors 38 and 22 (FIG. 1) are energized to activate the dual gate MOSFET switch 18 of sense cell 2. During the time $\Delta t_2$, the timing pulse PC activates precharge switch 64 and a reference voltage is applied to the sense (pn) junction of the sense cell 2 to charge it to the reference potential. At time $t_2$ (FIG. 4) the addresses change, $Y_1$ remains high, and $X_2$ goes high; while $Y_2$ remains low, and $X_1$ goes low. With $Y_1$ and/or $X_1$ low, sense cell 2 (FIG. 1) is electrically isolated (floating). Sense cell 2 remains floating for the remainder of its cycle period during which time photon generated charges, representative of light impinging on the sense cell 2, are collected on the junction capacitance. Further, with $Y_1$ and $X_2$ terminals high, conductors 38 and 28 are energized to activate the dual gate MOSFET switch 18 of sense cell 3.

Then at time $t_3 - \Delta t_3$ (FIG. 4), the precharge switch 64 (FIG. 1) is activated for the time $\Delta t_3$ and cell 3 is charged to the reference voltage. At time $t_3$ (FIG. 4) the addresses change; $Y_2$ and $X_1$ go high, while $Y_1$ and $X_2$ go low. With $Y_1$ and/or $X_2$ low, cell 3 (FIG. 1) is floating for the remainder of its cycle period during which time photon generated charges, representative of the light impinging on cell 3, are collected at its junction capacitance. Further, with $Y_2$ and $X_1$ terminals high, conductors 32 and 22 are engerized to activate dual gate MOSFET switch 18 of cell 1.

Then at time $t_4 - \Delta t_4$ (FIG. 4), the precharge switch 64 (FIG. 1) is activated for the time $\Delta t_4$ and sense cell 1 is charged to the reference voltage. At time $t_4$ (FIG. 4) $Y_2$ remains high and $X_2$ goes high while $Y_1$ remains low and $X_1$ goes low. With $Y_2$ and/or $X_1$ low (FIG. 1), cell 1 is floating for the remainder of its cycle period during which time, photon generated charges representative of the light impinging on cell 1 are collected at its junction capacitance. Further, with $Y_2$ and $X_2$ terminals high, conductors 32 and 28 are energized to activate the dual gate MOSFET switch 18 of cell 4.

Finally, at the time $t_1 - \Delta t_1$ (FIG. 4) the precharge switch 64 (FIG. 1) is activated for the time $\Delta t_1$ and cell 4 is charged to the reference voltage. At time $t_1$ (FIG. 4) the addresses change; $Y_1$ and $X_1$ go high, while $Y_2$ and $X_2$ go low. With $Y_2$ and/or $X_2$ low, cell 4 is floating for the remainder of its period during which time photon generated charges, representative of the light impinging on cell 4. are collected at its junction capacitance. Further, with $Y_1$ and $X_1$ (FIG. 1) high conductors 38 and 22 are energized to activate the dual date MOSFET switch of cell 2 to begin the second cycle.

During the second and each successive cycle thereafter, from the time $t_1$ to $(t_2-\Delta t_2)$ the multiplexer switch 46 connected by line 38 to $Y_1$ terminal, which is high, is activated and the voltage of cell 2 is applied through conductor 60 to the output amplifier 68. Then during the time $\Delta t_2$ cell 2 is recharged to the reference voltage. Next, during the time from $t_2$ to $(t_3 - \Delta t_3)$ with the $Y_1$ terminal still high the same multiplexer switch 46 is activated and the voltage cell 3 is similarly applied to the output amplifier 68. Then, during $\Delta t_3$, cell 3 is recharged to the reference voltage. Next, during the time from $t_3$ to $(t_4-\Delta t_4)$, when the terminal $Y_2$ is high, line 32 is energized to activate multiplexer switch 50 and the voltage of cell 1 is applied to output amplifier 68. Then, during $\Delta t_1$, cell 1 is recharged to the reference voltage. Finally, during the time from $t_4$ to $(t_1-\Delta t_1)$ with $Y_2$ terminal still high the same multiplexer switch is activated and the voltage of cell 4 is applied to the output amplifier 68.

From the above description it is evident that the X address rate is faster than the Y address rate and that each cell of a row is addressed by the X address circuit for each Y address of the Y address circuit. In this fashion each row of cells is summed from left to right.

By simply changing the X or Y clock sequence the addressing order can be altered.

A quantitative analysis of the images is as follows. The signal applied to the amplifier from any one of the array of cells is:

$$V_{sig}(t) = \left[ \int_{t-\tau}^{t} I(t)dt \right] / [C_{diff} + C_s]$$

where:
$C_{diff}$ is the diode capacitance,
$C_s$ is the sense line capacitance for the row containing the particular cell; and
I is the photo generated electrical current. The cell photo current is as follows:

$$I(t) = q\eta\phi(t)A$$

where:
q is the electron charge ($1.6 \times 10^{-19}$ coulomb)
$\eta$ is the quantum efficiency;
$\phi(t)$ is the photon flux (photons cm$^{-2}$ sec$^{-1}$);
A is the n+ diffusion area (cm$^2$). Then with the definition:

$$\bar{\phi}(t) = \tau^{-1} \int_{t-\tau}^{t} \phi(t)(dt)$$

the voltage signal is:

$$V_{sig}(t) = q\eta\bar{\phi}(t)\tau A/(C_{diff}+C_s)$$

The capacitance of the pn junction depletion region is:

$$(C_{diff})^2 = q\epsilon\epsilon_o N_D N_A A^2 / [2(\phi_o + V_{REF})(N_D + N_A)]$$

where:

$\epsilon$ is the relative dielectric constant (12)

$\epsilon_o$ is the permittivity of free space ($8.85 \times 10^{-14}$ farads cm$^{-1}$)

$N_D$ is the donor concentration ($\gtrsim 10^{19}$ cm$^{-3}$)

$N_A$ is the acceptor concentration ($2 \times 10^{15}$ cm$^{-3}$)

$\phi_o$ is junction potential at zero bias (0.68 volts)

$V_{REF}$ is 7 volts.

then $$C_{diff}/A = 4.70 \times 10^{-9} F/cm^2 = 0.30 \text{ pf/mil}^2$$

An estimate of the quantum efficiency can be made by assuming only those photons absorbed in the depletion region of the diode contribute to the signal current. The incident photon must first penetrate the n+ diffusion of length $X_{n+}$ and then be absorbed in the depletion region of length $X_{dep}$. The probability of this happening is just $$\eta = \exp(-\alpha X_{n+})(1-\exp(-\alpha X_{dep}))$$

where:

$\alpha$ is the absorption coefficient;

$\bar{\alpha} \simeq 7 \times 10^3$ cm$^{-1}$, for photon wavelength $\lambda(0.5\mu < \lambda < 0.62\mu)$, $X_{n+} \simeq 2 \times 10^{-4}$ cm, $X_{dep} = 2.3 \times 10^{-4}$ cm, and $V_{REF} = 7$ volts.

Thus, $\eta$ is about 0.2.

With standard room light (SRL) the illumination is approximately $10^{-2}$ lumens per square centimeter. This gives $\phi_{SRL}$ equal to $4.05 \times 10^{13}$ photons cm$^{-2}$ sec$^{-1}$ at 5550 Å. For a charge collection time, $\tau$, of 16.7 milsec:

$$V_{sig} = 4.6/(1 + C_s/C_{diff}) \text{ volts.}$$

For a 1 mil square diffusion and a sense line stray capacitance of 20 pf $$V_{sig} \simeq 6.9 \text{ mv.}$$

In terms of signal responsivity, R, this is $3 \times 10^9$ volts/watt. For clarity of analysis second order terms, e.g., voltage dependence of $C_{diff}$, the lifetimes of the carriers, etc., are not included; their omission from the calculations does not affect significantly the order of magnitude.

Although only a single embodiment of this invention has been described herein, it will be apparent to a person skilled in the art that various modifications to the details of construction shown and described can be made without departing from the scope of this invention.

What is claimed is:

1. An imaging device comprising:
an addressing means; an array of optoelectronic semiconductor elements selectively connected to the addressing means; a multiplexer connected to the array of optoelectronic semiconductor elements; a precharge means including a time controlled switch connected to the multiplexer; and an amplifier connected to the multiplexer, said array of optoelectronic semiconductor elements having its elements arranged for exposure to light emanating from a scene in the field of view for converting the light into electrical signals representative of the impinging light, and said precharge means, addressing means and multiplexer for alternately charging the elements of the array of optoelectronic semiconductor elements to a preselected voltage and connecting the electrical signals of the elements of the array of optoelectric semiconductor elements representing the intensity of light impinging thereon to the amplifier, said amplifier for amplifying the outputs of the array of optoelectronic semiconductor elements to a working level for processing into video signals for display.

2. An imaging device according to claim 1 wherein the precharge means comprises a MOSFET switch having drain, gate, and source electrodes, said drain electrode for connection to a reference voltage, said source electrode connected to the multiplexer, and said gate connected to a timer for selectively energizing the MOSFET switch to apply the reference voltage to the multiplexer for selected application of the reference voltage to the array of photoelectronic semiconductor elements.

3. An imaging device according to claim 1 wherein said addressing means comprises an X address circuit and a Y address circuit.

4. An imaging device according to claim 2 wherein the array of optoelectric semiconductor elements has its elements arranged in rows and columns with the rows of elements connected to the Y address circuit and the columns of elements connected to the X address circuit.

5. An imaging device according to claim 4 wherein said array of optoelectronic semiconductor elements is a metal oxide semiconductor integrated circuit.

6. An imaging device according to claim 4 wherein each element of the array of optoelectronic semiconductor elements comprises a photodiode and a switching means, said switching means operative in response to X and Y addresses for accessing the photodiode.

7. An imaging device according to claim 6 wherein each photodiode of the array of optoelectronic semiconductor elements comprises an n+ type conductivity region in a p type conductivity silicon substrate, said n+ type conductivity region forming with said p-type conductivity substrate a p-n junction whereby light falling on the p-n junction produces free electrons flowing from p to n.

8. An imaging device according to claim 6 wherein the switching means of the element comprises first and second switches connected in cascade, said first switch connected to the Y address circuit and said second switch connected to the X address circuit.

9. An imaging device according to claim 6 wherein the switching means comprises a plurality of MOSFET switches connected in series.

10. An imaging device according to claim 6 wherein the switching means comprises a dual gate MOSFET switch having a first gate connected to the Y address circuit and the second gate connected to the X address circuit.

11. An imaging device according to claim 10 wherein said dual gate MOSFET switch comprises a first n+ region in contact with the n+ region of the photodiode and a second n+ region in a spaced relationship to the first n+ region, said first and second n+ regions forming, respectively, the drain and source regions, and a dual gate metallization having first and second electrodes for connection to the X and Y address circuits.

* * * * *